United States Patent
Eggermont

(10) Patent No.: US 11,769,987 B2
(45) Date of Patent: Sep. 26, 2023

(54) METHODS AND SYSTEMS OF DRIVING ARRAYS OF DIODES

(71) Applicant: SEMICONDUCTOR COMPONENTS INDUSTRIES, LLC, Phoenix, AZ (US)

(72) Inventor: Jean-Paul Anna Joseph Eggermont, Pellaines (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 1035 days.

(21) Appl. No.: 16/255,291

(22) Filed: Jan. 23, 2019

(65) Prior Publication Data

US 2020/0067269 A1    Feb. 27, 2020

Related U.S. Application Data

(60) Provisional application No. 62/720,833, filed on Aug. 21, 2018.

(51) Int. Cl.
*H01S 5/042* (2006.01)
*G01S 7/484* (2006.01)
*G01S 17/10* (2020.01)
*H01S 5/42* (2006.01)
*H05B 41/282* (2006.01)

(52) U.S. Cl.
CPC ............ *H01S 5/0428* (2013.01); *G01S 7/484* (2013.01); *G01S 17/10* (2013.01); *H01S 5/04256* (2019.08); *H01S 5/423* (2013.01); *H05B 41/2828* (2013.01); *H01L 2924/1203* (2013.01); *H01L 2924/1204* (2013.01); *H01L 2924/1206* (2013.01); *Y10S 505/87* (2013.01)

(58) Field of Classification Search
CPC .................... H01S 5/0428; H01S 5/40–426
See application file for complete search history.

(56) References Cited

U.S. PATENT DOCUMENTS

| | | | |
|---|---|---|---|
| 5,736,881 A * | 4/1998 | Ortiz ................ | H05B 45/3725 327/515 |
| 5,835,515 A * | 11/1998 | Huang ................ | G02B 6/4272 372/75 |
| 6,697,402 B2 * | 2/2004 | Crawford ............. | H01S 5/042 372/38.03 |
| 7,061,534 B2 * | 6/2006 | Kakiuchi ............. | G01S 7/4811 348/370 |
| 7,545,839 B2 * | 6/2009 | Giorgi .................. | H01S 5/042 372/38.07 |
| 8,613,536 B2 * | 12/2013 | Joseph ................. | F21K 9/00 362/19 |
| 9,368,936 B1 | 6/2016 | Lenius et al. | |
| 9,570,997 B2 * | 2/2017 | Theiler ................ | H05B 45/46 |
| 9,847,736 B2 * | 12/2017 | Grootjans ............ | G01C 3/08 |
| 10,158,211 B2 * | 12/2018 | Barnes ................. | H01S 3/10 |
| 10,574,026 B2 * | 2/2020 | Mignoli .............. | G01S 7/484 |

(Continued)

FOREIGN PATENT DOCUMENTS

CN           114594453 A  *  6/2022

*Primary Examiner* — Tod T Van Roy
(74) *Attorney, Agent, or Firm* — Dickinson Wright PLLC; Mark E. Scott

(57) ABSTRACT

Driving arrays of diodes. At least some of the example embodiments are methods of driving an array of diodes including: charging an inductor to increase an inductor current, the charging ceases when the inductor current reaches a predetermined threshold; driving the inductor current through a first portion of the array of diodes, the driving ceases prior to the inductor current reaching zero; and recirculating the inductor current through the inductor until a next charging event.

20 Claims, 5 Drawing Sheets

(56) References Cited

U.S. PATENT DOCUMENTS

| | | | |
|---|---|---|---|
| 10,903,621 B2* | 1/2021 | Stern | H01S 5/0428 |
| 11,245,247 B2* | 2/2022 | Colles | H01S 5/0261 |
| 11,398,716 B2* | 7/2022 | Hegblom | H01S 5/04256 |
| 2003/0016711 A1* | 1/2003 | Crawford | H01S 5/042 |
| | | | 372/38.02 |
| 2010/0283322 A1* | 11/2010 | Wibben | H02M 3/158 |
| | | | 307/31 |
| 2010/0295472 A1* | 11/2010 | Wibben | H02M 3/158 |
| | | | 307/31 |
| 2014/0079088 A1* | 3/2014 | Joseph | G02B 6/4214 |
| | | | 372/50.12 |
| 2014/0104592 A1 | 4/2014 | Tien et al. | |
| 2014/0211192 A1* | 7/2014 | Grootjans | H05B 45/48 |
| | | | 356/5.01 |
| 2014/0269799 A1* | 9/2014 | Ortiz | H01S 5/0428 |
| | | | 372/38.02 |
| 2017/0085057 A1* | 3/2017 | Barnes | H01S 5/0428 |
| 2018/0188360 A1* | 7/2018 | Berger | G01S 17/06 |
| 2018/0278017 A1* | 9/2018 | Mignoli | H01S 5/0607 |
| 2019/0025406 A1* | 1/2019 | Krelboim | H01S 5/062 |
| 2019/0229493 A1* | 7/2019 | Stern | H01S 5/0428 |
| 2020/0067269 A1* | 2/2020 | Eggermont | H01S 5/423 |
| 2021/0021098 A1* | 1/2021 | Kaymaksut | H01S 5/0428 |
| 2021/0066885 A1* | 3/2021 | Kuo | H01S 5/0608 |
| 2021/0098965 A1* | 4/2021 | Crawford | H02J 7/345 |
| 2021/0104866 A1* | 4/2021 | Avci | H01S 5/0261 |
| 2021/0281173 A1* | 9/2021 | Eirea | H02M 1/00 |
| 2022/0045479 A1* | 2/2022 | Wagner | H01S 5/0608 |

* cited by examiner

METHODS AND SYSTEMS OF DRIVING ARRAYS OF DIODES

CROSS-REFERENCE TO RELATED APPLICATIONS

This application claims the benefit of U.S. Provisional Application No. 62/720,833 filed Aug. 21, 2018, and titled "Inductive topology for LIDAR Driver." The provisional application is incorporated by reference herein as if reproduced in full below.

BACKGROUND

Many systems use light detection and ranging (hereafter "lidar") to implement vision-like control. Such systems include weapons systems, mobile autonomous robots, safety systems for automobiles, and semi-autonomous and autonomous driving systems. In order to decrease granularity of the images derived from lidar systems, the number of laser diodes in the illumination arrays used to illuminate the viewing area is increasing, as is the number of photodiodes in the detection arrays.

The increased number of laser diodes in the illumination arrays presents problems and difficulties in efficiently driving the larger illumination arrays.

BRIEF DESCRIPTION OF THE DRAWINGS

For a detailed description of example embodiments, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Row" as it relates to an array of laser diodes (e.g., an array of vertical-cavity surface-emitting laser diodes) shall mean a plurality, but less than all, of laser diodes of the array electrically coupled in such a way that the plurality of laser diodes are driven simultaneously by an applied current and/or voltage. Row shall not imply any orientation in any coordinate system, and thus a row of an array of laser diodes could be vertically oriented, horizontally oriented, orientated at any angle relative horizontal, or take any non-straight line shape.

"Controller" shall mean individual circuit components, an application specific integrated circuit (ASIC), a microcontroller with controlling software, a digital signal processor (DSP), a processor with controlling software, a field programmable gate array (FPGA), or combinations thereof, configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various example embodiments are directed to methods and systems of driving arrays of diodes. More particularly, example embodiments are directed to an inductive topology for driving pulses of current to rows of an array of diodes. More particularly still, example embodiments are directed to driving individual rows of an array of laser diodes using current through an inductor. When the pulse time is complete current is recirculated through the inductor to increase efficiency of the overall system, and to decrease the charge time of the inductor for the next pulse. The specification first turns to an overall system to orient the reader.

Figure 1:
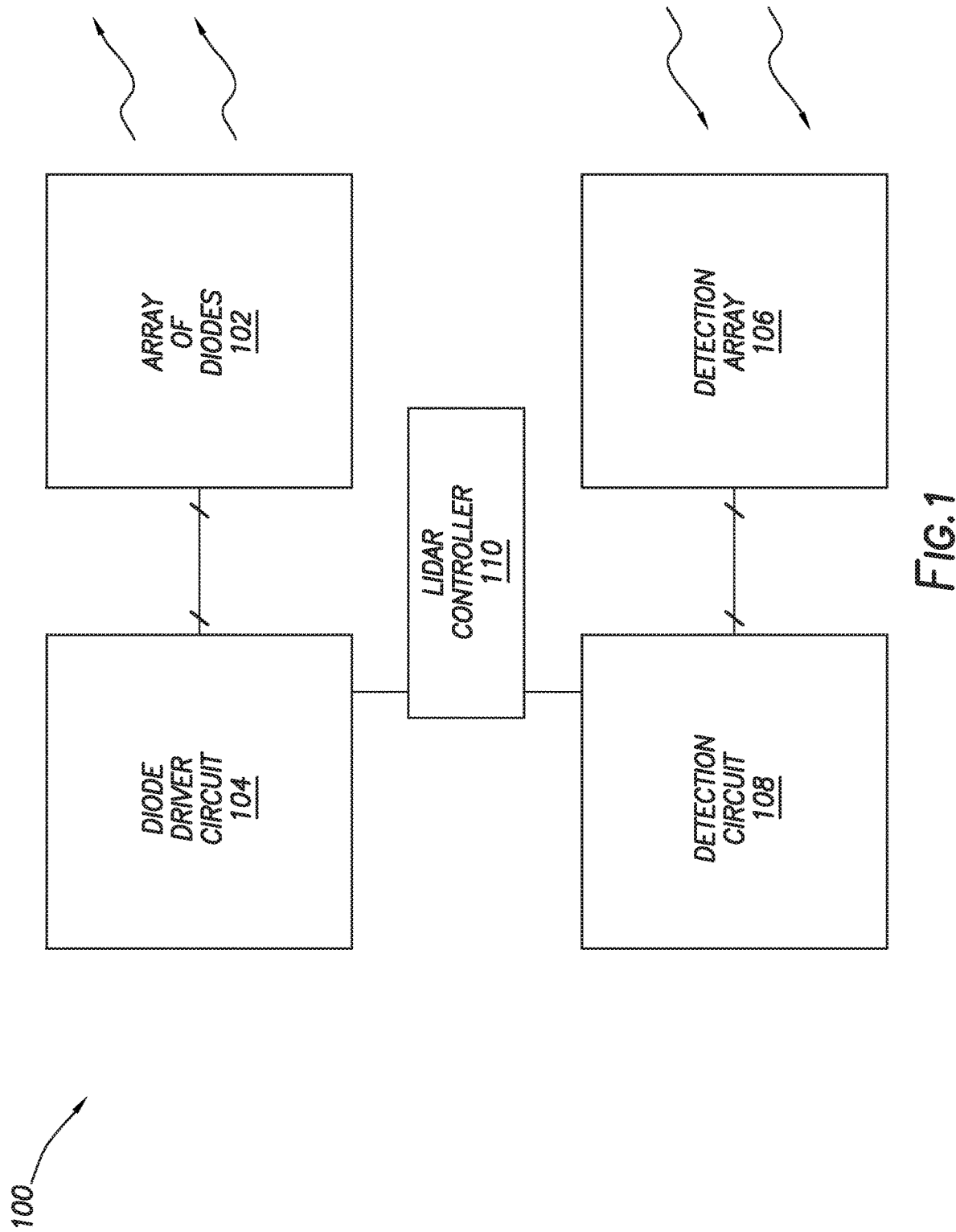
FIG. 1 shows a block diagram of a lidar system in accordance with at least some embodiments.

FIG. 1 shows, in block diagram form, a lidar system 100 in accordance with at least some embodiments. In particular, the example lidar system 100 comprises an array of diodes 102, a diode driver circuit 104, a detection array 106, a detection circuit 108, and a lidar controller 110. In use, the array of diodes 102 illuminates a target area (e.g., the scene in front of an automobile) with light. In one example case the array of diodes 102 is an array of laser diodes (e.g., an array of vertical-cavity surface-emitting laser (VCSEL) diodes). In some cases the light created by the array of diodes 102 is within the visible spectrum, and in other cases the light created is outside the visible spectrum, such as ultraviolet or infrared light. Though not shown in FIG. 1, the array of diodes 102 is conceptually divided into rows of diodes (hereafter just "row" or "rows"), though using the term "row" does not necessarily imply a horizontal row. In an example lidar system 100, each row of the array of diodes 102 is focused on a particular portion of a target area. That is, each row is pointed and/or focused such that, when activated, a particular row illuminates a particular portion of the target area. All the rows considered together thus illuminate the entire target area, though not necessarily at the same time.

In example systems, the rows of the array of diodes 102 are driven one at time by the diode driver circuit 104. In particular, the diode driver circuit 104 is coupled to the array of diodes 102 such that the diode driver circuit 104, at the command of the lidar controller 110, may individually drive each row in the array of diodes 102. The lidar controller 110 is communicatively coupled to the diode driver circuit 104, and may thus command the diode driver circuit 104 regarding the illumination process. In some cases the lidar controller 110 commands the diode driver 104 to drive particular rows of the array of diodes, and the particular rows need not be sequential or in any particular order. Since lidar is a time-of-flight type system, the diode driver circuit 104 provides the lidar controller 110 with an indication of the point in time when a row of the array of diodes 102 has been activated (e.g., start), and an indication of the point in time when the activation ceases (e.g., end). The lidar controller 110, in turn, may provide the indications to the detection circuits 108 and any other system that uses the start and end information.

Still referring to FIG. 1, a portion of the light launched into the target area is reflected back to the detection array 106. In one example case the detection array 106 is an array of photo diodes designed and constructed to be sensitive to the wavelength of light produced by the array of diodes 102. Though not shown in FIG. 1, the detection array 106 may likewise be organized into rows, with each row of the array designed and constructed to receive light from a particular portion of the target area. That is, each row of diodes in the detection array 106 is arranged, pointed, and/or focused such that light reflected from objects in that portion of the target area is detected by the row. All the rows considered together thus receive reflected light from the entire target area, though not necessarily at the same time. From the light detected by each row of the detection array 106, the location of objects and movement of the objects in the target area may be determined. The specification now turns to a description of the diode driver circuit 104 and the array of diodes 102 in greater detail.

Figure 2:
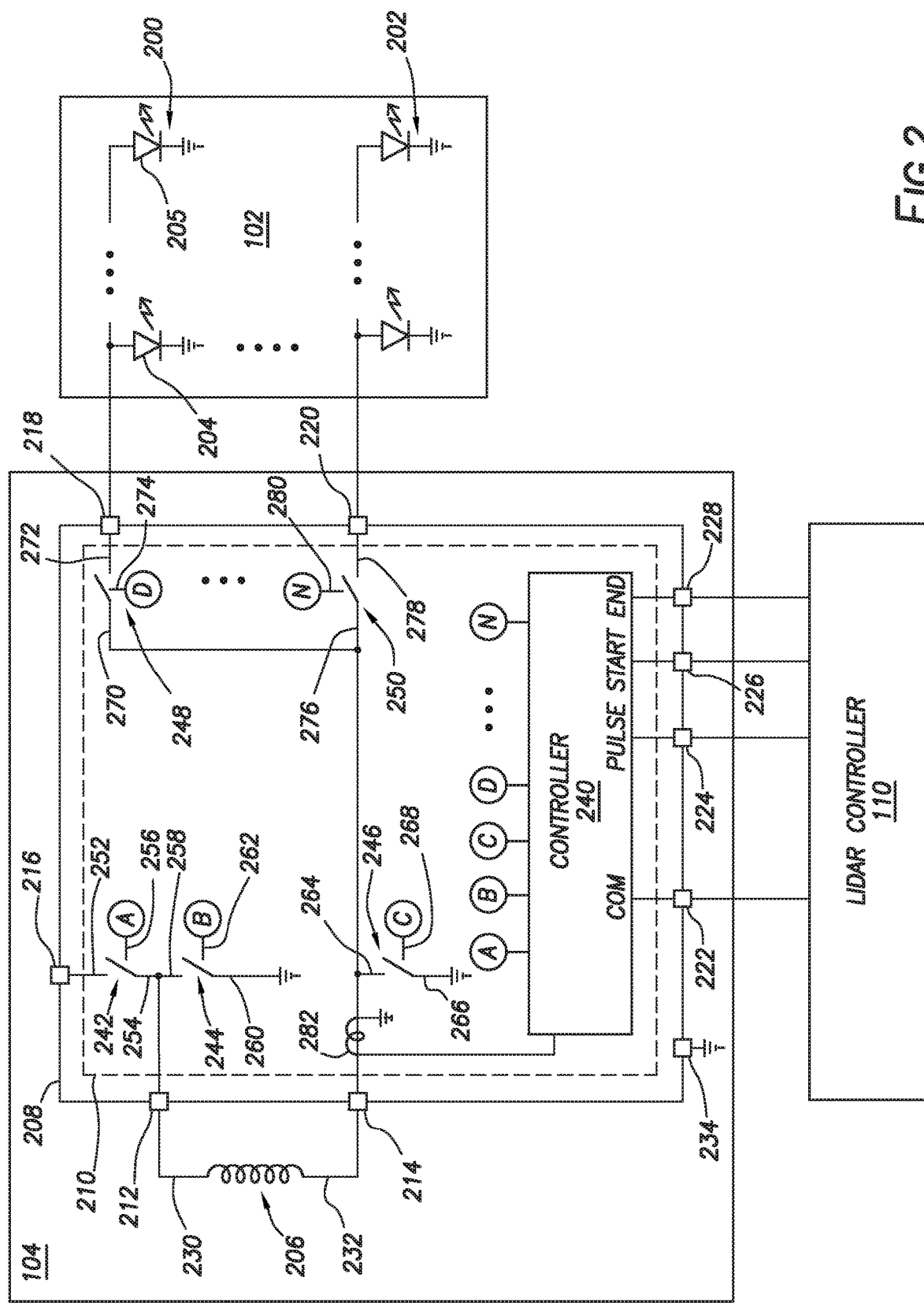
FIG. 2 shows a partial block diagram, partial schematic, of a portion of a lidar system in accordance with at least some embodiments.

FIG. 2 shows a partial block diagram, partial schematic, of a portion of a lidar system in accordance with at least some embodiments. In particular, FIG. 2 shows the diode driver circuit 104, the array of diodes 102, and the lidar controller 110. Referring initially to the array of diodes 102, in example systems the array of diodes 102 comprises an array of laser diodes (e.g., VCSEL diodes). As alluded to above, the array of diodes 102 is divided into a plurality of rows, such as example row 200 and row 202. Only two rows 200 and 202 are shown so as not to unduly complicate the figure. Each row comprises a plurality of diodes. Only two diodes are shown in each row so as not to unduly complicate the figure. The diodes in each row are arranged such that a pulse of voltage and/or current illuminates all the diodes in the row simultaneously. Referring to row 200 as representative, row 200 comprises a diode 204, a diode 205, and one or more diodes disposed between diodes 204 and 205. In the example case of FIG. 2, the diodes 204 and 205 are shown coupled in parallel, with their anodes directly coupled and their cathodes coupled to ground. Other arrangement are possible, and thus the specific parallel arrangement should not be considered limiting. Each row 200 and 202 of the array of diodes 102 is electrically coupled to the diode driver circuit 104.

The example diode driver circuit 104 of FIG. 2 comprises an inductor 206 coupled to a diode driver 208. The example diode driver 208 is, in example embodiments, a packaged semiconductor device having any suitable form factor, such as a 940AK package dual inline module. The diode driver 208 may comprise one or more substrates of semiconductor material (e.g., silicon), such as substrate 210, encapsulated within the packaging. Bond pads or other connection points of the substrate 210 couple to electrical terminals of the diode driver 208. The example diode driver 208 defines a first inductor terminal 212, a second inductor terminal 214, a power supply terminal 216, and a plurality of driver terminals (represented by driver terminals 218 and 220). The example diode driver 208 further defines a plurality of terminals that enable communication with the lidar controller 110, such as communication terminal 222, pulse terminal 224, start terminal 226, and end terminal 228.

The example inductor 206 defines a first lead 230 coupled to the first inductor terminal 212, and a second lead 232 coupled to the second inductor terminal 214. The power supply terminal 216 couples to power supply or voltage supply (not specifically shown to as not to further complicate the figure). The representative driver terminal 218 couples to the row 200 of the array of diodes 102. Similarly, representative driver terminal 220 couples to row 202 of the array of diodes 102. Though only two driver terminals shown, in practice the diode driver 208 may have a driver terminal for each row of the array of diodes 102. The example communication terminal 222, the pulse terminal 224, the start terminal 226, and the end terminal 228 all couple to the lidar controller 110. Finally, the diode driver 208 defines a ground terminal 234 coupled to ground. The internal connections to the ground terminal 234 are not shows so as not to further complicate the figure.

In accordance with example embodiments, the diode driver 208, at the command of the lidar controller 110, drives voltage and/or current to each row of the array of diodes 102. More particularly, the example diode driver 208 initially charges the inductor 206 to create electrical current flowing through the inductor 206 (hereafter just "inductor current"). If the charging is the first charging event after a power up of the diode driver 208, then the inductor current ramps up from zero; however, on the second and subsequent charging events, the inductor current may be non-zero when the charging begins, and thus the charging event increases the inductor current. Once the inductor current reaches a predetermined threshold, the charging ceases. In some cases the predetermined threshold may be set by the lidar controller 110 by communication through the communication terminal 222. The predetermined threshold may be communicated for each charging event. In other cases the predetermined threshold may be communicated once at system initialization. In other cases, the predetermined threshold may be set by the diode driver 208 itself without input from the lidar controller 110, such as by external resistors (not shown) coupled to the diode driver 208.

Once the charging ceases, the inductor current is directed or driven through a first portion of the array of diodes 102. In example embodiments, the inductor current is driven through a single row (e.g., row 200) of the array of diodes. In other cases, the inductor current is driven through two or more rows, but less than all the rows of the array of diodes 102. In cases where two or more rows are simultaneously driven, the rows may be adjacent rows or non-adjacent rows. The diodes in the row(s) thus illuminate a portion of the target area. In example cases, the switch transitions to provide the current, and then stop current, may occur quickly (e.g., 1 nano-second or less) to provide pulse of light with sharp start/stop delineation to increase the accuracy of time-of-flight detection.

The diode driver 208 drives the inductor current through the portion of the array of diodes 102 for predetermined period of time. In some cases the predetermined period of time is set by the lidar controller 110 by communication through the communication terminal 222. The predetermined period of time may be communicated for each driving event. In other cases the predetermined period of time may be communicated once at system initialization. In other cases, the predetermined period of time may be set by the diode driver 208 itself without input from the lidar controller 110, such as by external resistors (not shown) coupled to the diode driver 208. Regardless of the length of the predetermined period of time, in example cases driving the inductor current through a portion of the array of diodes 102 ceases prior the inductor current reaching zero. In order to increase efficiency of the diode driver circuit 104, and decrease an amount of time to charge the inductor 206 during the next charging event, the inductor current is recirculated through the inductor 206 until the next charging event. That is, after driving the inductor current to a row of the array of diodes 102, the leads 230 and 232 are shorted together such that the inductor current recirculates through the inductor 206, with the losses being largely limited to resistive loses in the circulation path.

The process of charging, driving the inductor current, and recirculating repeats for each portion (e.g., row) of the array of diodes 102. In some cases, the next portion to be driven is directly identified by the lidar controller 110. In other cases, the selected portion or row may be a pattern programmed by the lidar controller 110 during initialization. In some cases the lidar controller 110 may provide repetitive pulses to the same row. Assuming a system where the next portion to be driven is contemporaneously selected by the lidar controller 110, after recirculating the current for a period of time the lidar controller 110 may communicate with the diode driver 208 to identify a second portion to drive (and possibly changing any of the previous variables associated with the driving). Thus, the example process repeats, and again the diode driver charges the inductor 206 to increase the inductor current. Once the inductor current reaches the predetermined threshold, the charging ceases. The inductor current is then driven through a second portion of the array of diodes 102 (e.g., row 202). As before, the driving of the inductor current through the second portion of the array of diodes 102 ceases prior the inductor current reaching zero. And then the inductor current is recirculated through the inductor 206, awaiting the next charging event.

FIG. 2 further shows a partial electrical schematic, partial block diagram, of the diode driver 208 in accordance with at least some embodiments. In addition to the various terminals already introduced, the example diode driver 208 comprises a controller 240 defined on the substrate 210, as well as a plurality of switches defined on the substrate 210. In particular, the example diode driver 208 comprises a high-side switch 242, a low-side switch 244, a shorting switch 246, and a plurality of row switches (illustrated by row switches 248 and 250). In the drawing of FIG. 2, the switches are shown in electrical schematic form as physical switches; however, in example cases the switches are implemented using semiconductor construction techniques, and thus may be any device capable of performing a switch function, such as field effect transistors (FETs), bipolar junction transistors (BJTs), Gallium Nitride transistors, and related devices (e.g., silicon controlled rectifiers (SCRs), triode for alternating current (TRIACs)). Thus, as an example, the high-side switch 242 may be implemented as a NMOS FET with its drain defining a first lead, its source defining a second lead, and its gate defining a control input.

The high-side switch 242 in the example of FIG. 2 is defined on the substrate 210. The high-side switch 242 defines a first lead 252 coupled to the power supply terminal 216, a second lead 254 coupled to the first inductor terminal 212, and a control input 256. The low-side switch 244 in example embodiments is defined on the substrate 210. The low-side switch 244 defines a first lead 258 coupled to the first inductor terminal 212, a second lead 260 coupled to the ground terminal 234, and a control input 262. The shorting switch 246 in example embodiments is defined on the substrate 210. The shorting switch 246 defines a first lead 264 coupled to the second inductor terminal 214, a second lead 266 coupled to the ground terminal 234, and a control input 268. The example diode driver 208 comprises plurality of row switches defined on the substrate 210, the plurality of row switches defining a respective plurality of control inputs, each of the plurality of row switches coupled to the second inductor terminal, and the plurality of row switches coupled one each to the plurality of driver terminals. In FIG. 2, the plurality of row switches are represented by row switch 248 and row switch 250. Row switch 248 defines a first lead 270 coupled to the second inductor terminal 214, a second lead 272 coupled to the driver terminal 218, and a control input 274. Finally, row switch 250 defines a first lead 276 coupled to the second inductor terminal 214, a second lead 278 coupled to the driver terminal 220, and a control input 280.

Controller 240 couples to various devices both within the diode driver 208 and external devices. In particular, controller 240 couples to all the control inputs 256, 262, 268, 274, and 278 (as shown by "bubbles" A, B, C, D, and N, respectively). Moreover, controller 240 couples to various devices external to the diode driver 208 by way of terminals of the diode driver 208. In the example system of FIG. 2, the controller 240 couples to the lidar controller 110 by way of the example communication terminal 222, pulse terminal 224, start terminal 226, and end terminal 228. The controller 240 may thus receive messages from the lidar controller 110 by way of the communication terminal 110, such as receiving an indication of the portion or row of array of diodes 102 to illuminate, an indication of the predetermined threshold of current used for charging, and an indication of predetermined period of time used for setting pulse length. The communication implemented across the communication terminal 222 may take any suitable form, such as a serial communication where bits of information are clocked into a shift register (not specifically shown) within the controller 240. In such cases additional terminals would be present, such as a shift out terminal, a clock terminal, and a latch terminal, but these additional terminals are not shown so as not to unduly complicate the figure.

In the example system the controller 240 also receives a signal from the lidar controller 110 through the pulse terminal 224 indicating a desire for a pulse of voltage and/or current to occur. For example, the lidar controller 110 may assert the pulse terminal 224 as a signal to provide the pulse of voltage and/or current to the selected portion or row. As alluded to above, there may be delay in driving the current to the selected portion or row as the inductor is charged. Thus, in example embodiment the controller 240 may provide an indication of when driving begins by asserting the start terminal 226, and the controller 240 may provide an indication of when driving ceases by asserting the end terminal 228. Although shown as single singles, in other cases the pulse signal sent to the controller 240, the start signal sent to the lidar controller 110, and the end signal sent to the lidar controller 110 may be low-voltage differential signals (LVDS), and thus each of the pulse terminal 224, start terminal 226, and end terminal 228 may be sets of terminals on which differential signals are received or driven.

The controller 240 may take any suitable form. For example, the controller 240 may be individual circuit components constructed on the substrate 210, an application specific integrated circuit (ASIC) constructed on the substrate 210, a microcontroller constructed on the substrate 210 (with controlling software in a memory on or off the substrate 210), a digital signal processor (DSP) constructed on the substrate, a processor constructed on the substrate 210 (with controlling software in a memory on or off the substrate 210), a field programmable gate array (FPGA) constructed on the substrate 210, or combinations thereof, configured to read inputs (e.g., from the lidar controller 110) and drive outputs (e.g., the control inputs of the switches) responsive thereto.

Still referring to FIG. 2, having now described the components of the example system the specification turns to describing charging the inductor, driving the inductor current to the array of diodes 102, and recirculating the inductor current in relation to the example components. Consider that the diode driver circuit 104 is initially powered up and has yet to drive any current to the array of diodes 102. In example systems, the lidar controller 110 communicates with controller 240 conveying information such as a current setting which sets or dictates the predetermined threshold during charging, for example a current setting of between and including 2.25 Amps to 10 Amps. The lidar controller 110 may communicate a pulse width which sets or dictates the predetermine period of time, such as between and including 3 nano-seconds (ns) and 20 ns. The lidar controller 110 may communicate a row selection. Once the example communication is complete (e.g., the bits are latched in and provided to the controller 240), the controller 240 may close the designated row switch(es), and await assertion of the pulse terminal 244.

Once the pulse terminal 244 is asserted, the controller 240 places the plurality of switches in a charge configuration. For charge configuration in the example system the controller 240 makes conductive or closes the high-side switch 242 by asserting the control input 256, makes conductive or closes the shorting switch 246 by asserting the control input 268, and makes non-conductive or opens the low-side switch 244 by de-asserting the control input 262. Thus, the voltage supply coupled to the power supply terminal 216 is coupled to the inductor 206 through the high-side switch 242, and the inductor 206 is coupled to ground through the shorting switch 246. Current is generated through the inductor 206 as the field around the windings of the inductor 206 grows. Charging of the inductor continues until the inductor current reaches the predetermined threshold. In the example system of FIG. 2, the controller 240 monitors the inductor current by way of a current sense transformer 282 having single-turn primary and a secondary winding coupled to the controller 240; however, monitoring or measuring current may take any suitable form, such as a small current sense resistor in series with the inductor current, or the controller 240 being provided value of the inductor and voltage of the voltage supply, and calculating the current without an actual measurement. In any event, when the current reaches the predetermined threshold, the controller 240 transitions to placing the plurality of electrically controlled switches in a discharge configuration that drives the inductor current through the selected portion of the array of diodes 102.

Driving the inductor current in the discharge configuration may thus comprise opening the high-side switch 242 by de-asserting the control input 256, closing the low-side switch 244 by asserting the control input 262, and opening the shorting switch 246 by de-asserting the control input 268. If not previously closed, the driving may also comprise closing the selected row switch by asserting the respective control input. Moreover, the controller 240 may signal the lidar controller 110 that driving has begun by asserting the start terminal 226. Because current through an inductor 206 cannot change instantaneously, the inductor 206 thus drives the inductor current to the selected portion or row of the array of diodes 102. It may be possible to drive the inductor current to the selected row while leaving the high-side switch 242 closed (and not closing the low-side switch). However, in example embodiments, and for reasons of intrinsic safety, the high-side switch is opened which disconnects the voltage supply and limits the available energy that can be driven to the devices external to the diode driver 208. Since the high-side switch 242 is opened in example embodiments, the low-side switch 244 is closed to provide a current path. The controller 240 thus drives the inductor current to the selected row for the predetermined period of time. In other example cases, driving may cease based on other variables, such as the inductor current falling below a threshold (predetermined or otherwise).

Regardless of the trigger for ceasing the driving of the inductor current, the example method then transitions to placing the plurality of electrically controlled switches in the recirculation configuration, recirculating the remaining inductor current. In particular, the controller 240 closes the shorting switch 246. Given that the low-side switch 244 is already closed or conductive from the driving step, closing the shorting switch effectively shorts the leads of the inductor 206 (through the ground). Simultaneously with closing the shorting switch 246, the controller 240 may also assert the end terminal 228. Thus, the remaining inductor current circulates through the inductor 206 in anticipation of the next charging event. Because the remaining inductor current was re-circulated, during the next charging event the inductor current need only be increases to the predetermined threshold, rather than generated anew from the inductor current being zero (as is the case in the initial charging after power up). Recirculating the inductor current thus increases efficiency of the diode driver 208, and the overall diode driver circuit 104. Moreover, the rate of charging and driving may be increased relative to charging the inductor current from zero each time.

The various embodiments discussed to this point have assumed that all the switches reside within the diode driver 204, and particularly that all the switches are disposed on substrate 210. However, depending on the size of the array of diodes 102, the desired voltage/current of each pulse, the desired pulse time, number of rows simultaneously driven, and/or heat and temperature considerations, the lidar system may implement discreet switches (e.g., FETs) external to the diode driver 208 in place of or in addition to some of the internal switches.

Figure 3:
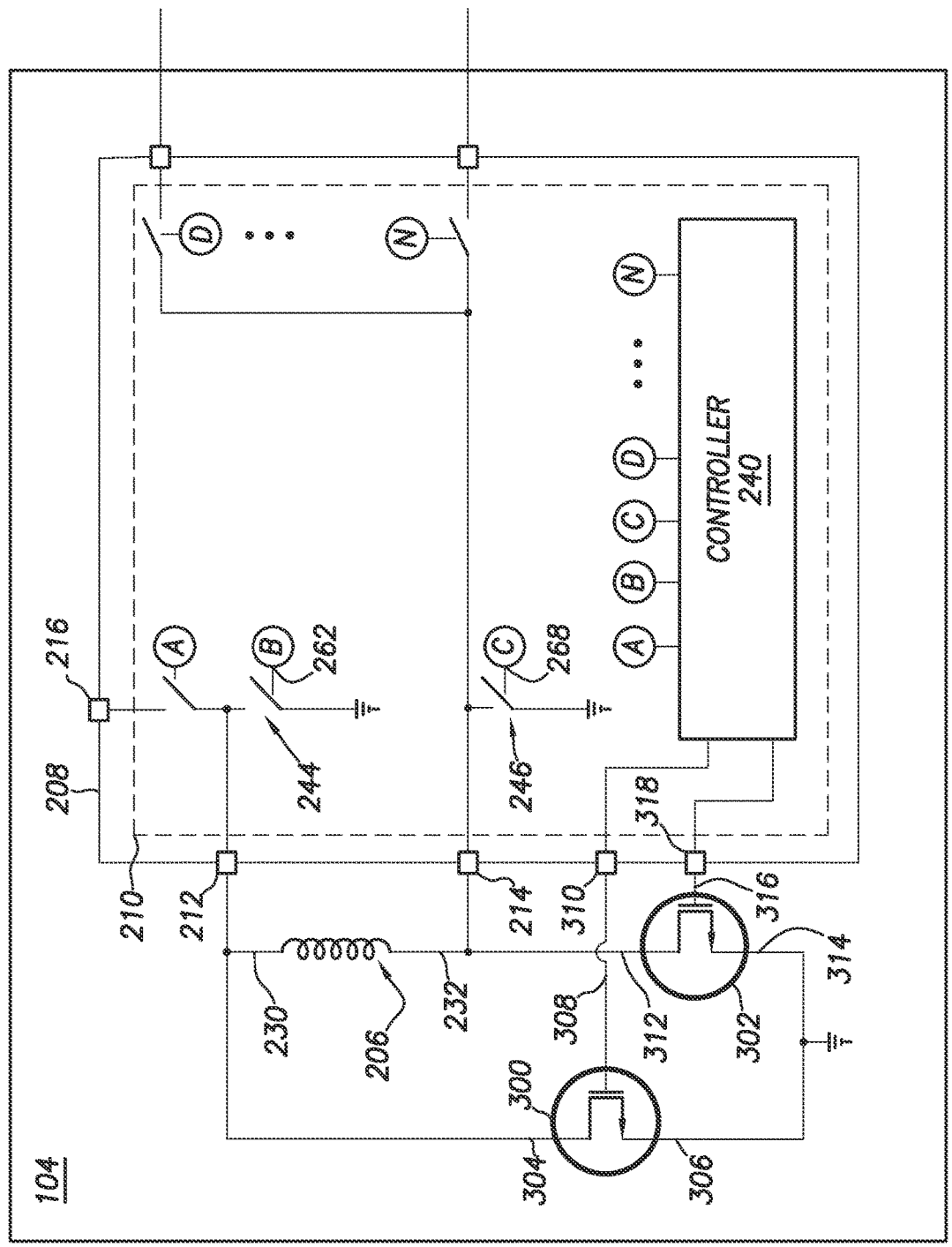
FIG. 3 shows a partial block diagram, partial schematic, of a portion of a lidar system in accordance with at least some embodiments.

FIG. 3 shows a partial block diagram, partial schematic, of a portion of a lidar system in accordance with at least some embodiments. In particular, FIG. 3 shows diode driver circuit 104 with a diode driver 208 that utilizes at least some switch devices external to the diode driver 208. More particularly still, for any of a number of reasons it may be desirable to not use, or not exclusively use, the internal switches as part of the charging, driving, and recirculating process. Thus, the example system of FIG. 3 comprises two FETs external to the diode driver 208. Example FET 300 is, in effect, an external low-side switch. Example FET 302 is, in effect, an external shorting switch.

In the system of FIG. 3, FET 300 defines a drain 304, source 306, and gate 308. The drain 304 couples to the first lead 230 of the inductor 206, the source 306 couples to ground, and the gate 308 couples to the controller 240 by way of a gate terminal 310. FET 302 defines a drain 312, source 314, and gate 316. The drain 312 couples to the second lead 232 of the inductor 206, the source 314 couples to ground, and the gate 316 couples to the controller 240 by way of a gate terminal 318. Thus, during operational conditions when the low-side switch 244 would be closed, the FET 300 may be made conductive by asserting the gate terminal 310 in addition to, or in place of, the low-side switch 244. During operational conditions when the shorting switch 246 would be closed, the FET 302 may be made conductive by asserting the gate terminal 318 in addition to, or in place of, the shorting switch 246.

In some cases, the lidar controller 110 (FIG. 2) may communicate with the controller 240 and command the controller 240 to use the external FETs 300 and 302 in additional to or in place of the internal switches. For example, the lidar controller 110 may command the controller 240 to enable use of the external devices (e.g., enable sending gate drive signals to the gate terminals 310 and 318) and disable use of the correlated internal switches (e.g., disable driving the respective control inputs 262 and 268). While in some cases the external devices may be used during each cycle, the lidar controller 110 may change the use from external to internal on a cycle by cycle basis if desired. Finally, while the example system of FIG. 3 uses the external devices as an external low-side switch and an external shorting switch, in other cases any of the noted switches within the diode driver 208 may have corresponding external devices, and in such cases the diode driver 208 will have a gate terminal for each such external device.

It follows that the lidar controller 110 may communicate information regarding whether to use the internal switches a pulse width which sets or dictates the predetermine period of time, such as between and including 3 nano-seconds (ns) and 20 ns. The lidar controller 110 may communicate a row selection. Once the example communication is complete (e.g., the bits are latched in and provided to the controller 240), the controller 240 may close the designated row switch(es), and await assertion of the pulse terminal 244.

Figure 4:
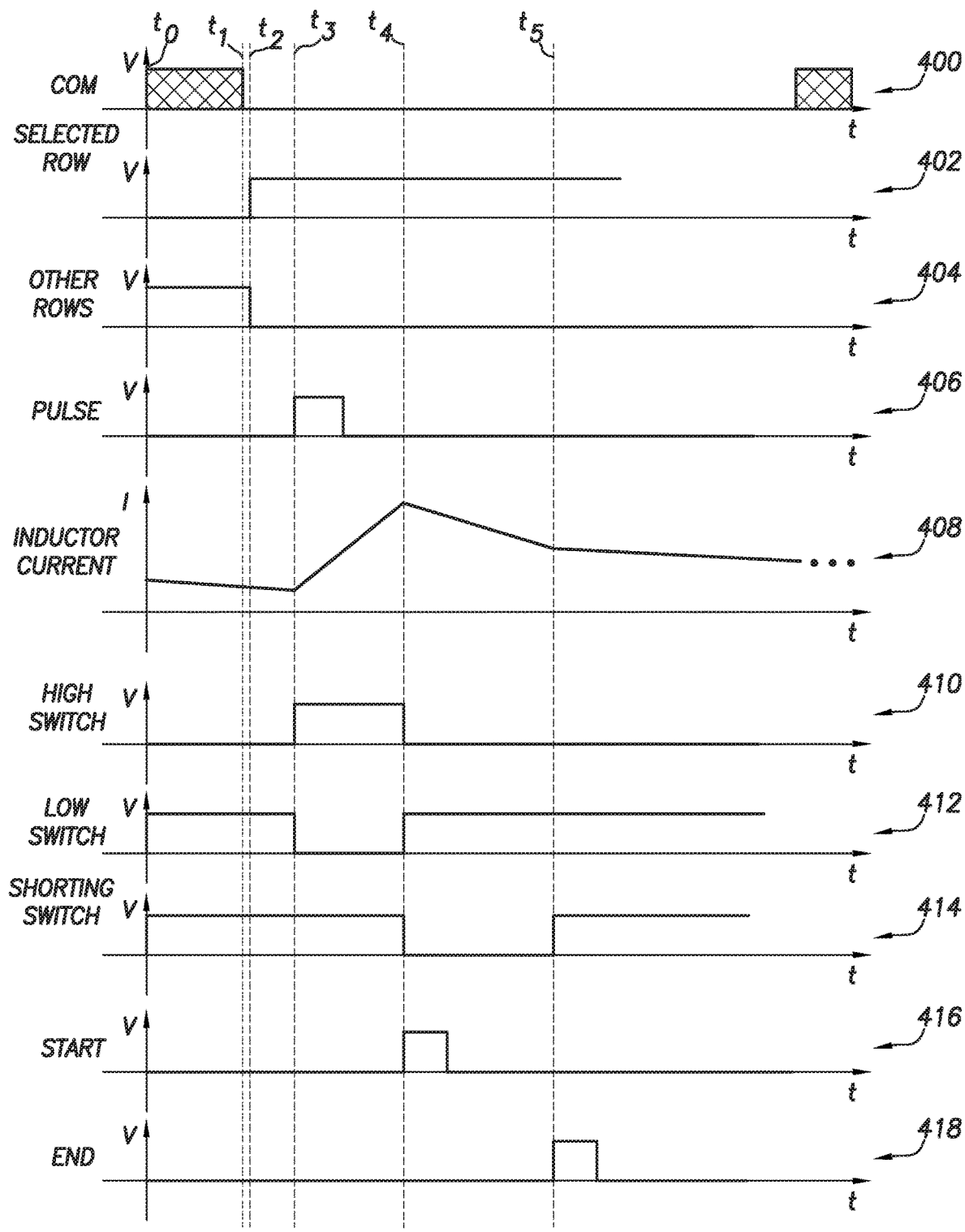
FIG. 4 shows a timing diagram in accordance with at least some embodiments.

FIG. 4 shows a timing diagram in accordance with at least some embodiments. In particular, FIG. 4 shows a plurality of plots of various signals all with corresponding time, though the time aspects are not necessarily to scale. The various plots of FIG. 4 show an example charge, drive, and recirculate cycle in accordance with example embodiments. Referring simultaneously to FIGS. 2 and 4, the following plots are shown: plot 400 shows a signal on the communication terminal 222; plot 402 shows a signal applied to the control input for a row switch of a selected row; plot 404 shows, as a group, signals applied to control inputs for non-selected rows; plot 406 shows a signal applied to the pulse terminal 224; plot 408 shows the inductor current; plot 410 shows a signal applied to the control input of the high-side switch 242; plot 412 shows a signal applied to the control input 262 of the low-side switch 244; plot 414 shows a signal applied to the control input 268 of the shorting switch 246; plot 414 shows a signal applied to the start terminal 226; and 418 shows a signal applied to the end terminal 228.

In the example timing diagram, at time t0 the controller 240 is receiving information from the lidar control 110 over the communication terminal 222, with the message ending at time t1. As discussed above, the message may contain information such as a current setting which sets or dictates the predetermined threshold during charging, a pulse width which sets or dictates the predetermine period of time, and a row selection. Once the example communication is complete at time t1, the controller 240 in the example system closes the selected row switches at time t2 as shown by plot 402, and opens the remaining row switches as shown by plot 404. Thereafter, the controller 240 awaits assertion of the example pulse terminal 224 which starts the charging step.

In the timing diagram of FIG. 4, the pulse terminal 224 is asserted at time t3 as shown in plot 406. In the example timing diagram the assertion of the pulse terminal is shown to be a pulse of relatively small width; however, the asserted time of the pulse terminal 224 may be extended as long as the pulse terminal 224 is de-asserted at any suitable time. Putting aside processing delay of the controller 240, when the pulse terminal 224 is asserted the controller 240 starts the charging step by closing the high-side switch 242 (plot 410) and opening the low-side switch 244 (plot 412) at time t3. The shorting switch 246 is assumed to already be closed to implement current recirculation (notice the non-zero current through the inductor as shown in plot 408 between times t0 and t3). The charging step ends when the inductor current reaches the predetermined threshold, in the timing diagram at time t4. The example method then transitions to the driving step.

At time t4, the example system transitions to the driving step by opening the high-side switch 242 (plot 410), and closing the low-side switch 244 (plot 412). In the example case shown, the switch for the selected row was closed at time t2; however, in other cases the row switch for the selected row may be closed at time t4. Thus, the inductor current is driven to the selected row, in the example timing diagram driving the inductor current occurs between times t4 and t5. Simultaneously with starting the driving step, in example cases the controller 240 informs the lidar controller 110 that the driving has begun by asserting the start terminal 226 (plot 416). In the example timing diagram the assertion of the start terminal 226 at time t4 is shown to be a pulse of relatively small width; however, the asserted time of the start terminal 224 may be extended so long as the pulse terminal 224 is de-asserted at any suitable time. When the driving step ends (e.g., based on predetermined period of time communicated by the lidar controller 110), the example method transitions to the recirculating the inductor current. In the example timing diagram the assertion of the end terminal 228 (plot 418) at time t5 is shown to be a pulse of relatively small width; however, the asserted time of the end terminal 228 may be extended so long as the end terminal 228 is de-asserted at any suitable time.

Still referring simultaneously to FIGS. 2 and 4, at time t5 the example method transitions to the recirculation step by closing the shorting switch 246 (plot 414). Closing the shorting switch effectively shorts leads of the inductor 206 (through the ground). The inductor current thus recirculates through the inductor 206 (plot 408) until the next charging event (the next charging event not shown in FIG. 4).

Figure 5:
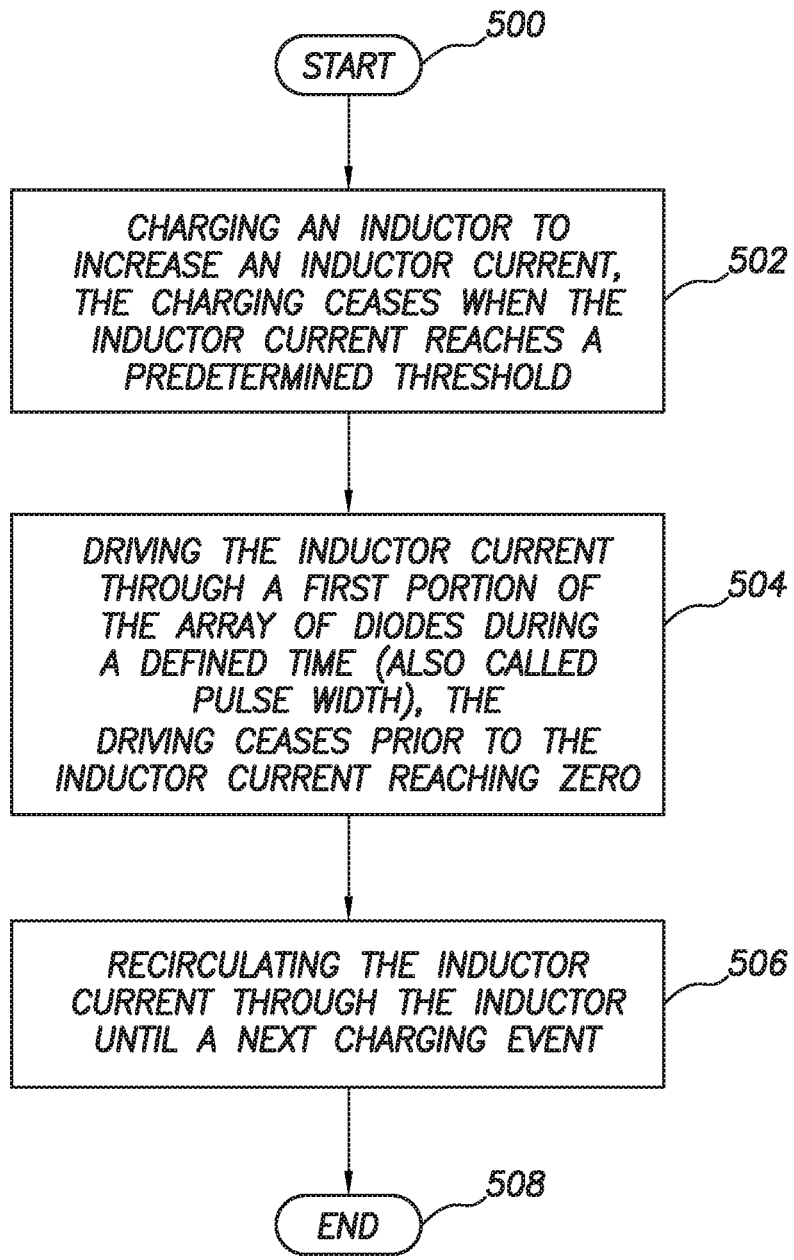
FIG. 5 shows a method in accordance with at least some embodiments.

FIG. 5 shows a method in accordance with at least some embodiments. In particular, the example method starts (block 500) and comprises: charging an inductor to increase an inductor current, the charging ceases when the inductor current reaches a predetermined threshold (block 502); driving the inductor current through a first portion of the array of diodes, the driving ceases prior to the inductor current reaching zero (block 504); and recirculating the inductor current through the inductor until a next charging event (block 506). Thereafter the methods ends (block 508), in some cases to be re-started for the next row in the array of diodes.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. For example, with respect to assertion of a signal, the assertion may be asserted high or asserted low. FIG. 4 shows assertions as asserted high for convenience, but such should not be read as limiting the meaning of assertion to just asserted high. As another example, the current flow in the example embodiments is to the rows of the array of diodes arranged with all the cathodes coupled to the driver terminal, and all the anodes coupled to ground; however, in other cases all the cathodes may be coupled to ground, and all the anodes coupled to the driver terminal, and in such cases the polarity of the pulse of current is reversed. In yet still other cases, the controller and related diode driver may have two inductors and related charging and recirculation circuits. Thus, as one inductor is providing a pulse of current, the second inductor could be charging, thus increasing the pulse rate of the overall system. It is intended that the following claims be interpreted to embrace all such variations and modifications.

What is claimed is:

1. A method of driving an array of laser diodes comprising:
    charging an inductor to increase an inductor current of the inductor, the charging ceases when the inductor current reaches a predetermined threshold, wherein the predetermined threshold is set by a controller;
    driving the inductor current through a first portion of the array of laser diodes, the driving ceases prior to the inductor current reaching zero; and
    recirculating the inductor current through the inductor until a next charging event,
    wherein driving the inductor current through the first portion of the array of laser diodes further comprises driving the inductor current through a row of the array of laser diodes, and
    wherein all of the laser diodes included in the row of the array of laser diodes are coupled in parallel with each other,
    wherein anodes of all of the laser diodes included in the row of the array of laser diodes are directly coupled to each other, and
    wherein cathodes of all of the laser diodes included in the row of the array of laser diodes are directly coupled to a ground.

2. The method of claim 1 wherein recirculating the inductor current through the inductor further comprises shorting leads of the inductor through a ground.

3. The method of claim 1 wherein recirculating the inductor current through the inductor further comprises:
    closing a low-side switch coupled between a first lead of the inductor and a ground;
    closing a shorting switch coupled between a second lead of the inductor and the ground; and
    opening a high-side switch coupled between a power supply and the first lead.

4. The method of claim 1 further comprising:
    charging the inductor to increase the inductor current, the charging ceases when the inductor current reaches the predetermined threshold, wherein the controller resets the predetermined threshold for each charging of the inductor;
    driving the inductor current through a second portion of the array of laser diodes, the second portion distinct from the first portion of the array of laser diodes, and the driving ceases prior to the inductor current reaching zero; and
    recirculating the inductor current through the inductor.

5. The method of claim 4:
    wherein driving the inductor current through the second portion of the array of laser diodes further comprises driving the inductor current through a second row of the array of laser diodes.

6. The method of claim 1 wherein charging the inductor further comprises:
    closing a first electrically controlled switch disposed between a power supply and a first lead of the inductor; and
    closing a second electrically controlled switch coupled between a second lead of the inductor and a ground.

7. The method of claim 1 wherein driving the inductor current further comprises coupling a first lead of the inductor to the first portion of the array of laser diodes.

8. The method of claim 7 wherein driving the inductor current further comprises de-coupling a second lead of the inductor from a power supply.

9. The method of claim 1 wherein the controller which sets the predetermined threshold is a controller which is associated with a lidar sensor.

10. A diode driver for driving an array of laser diodes, the diode driver configured to perform operations:
    charge an inductor to increase an inductor current of the inductor, the charging ceases when the inductor current reaches a predetermined threshold, wherein the predetermined threshold is set by a controller;
    drive the inductor current through a first portion of the array of laser diodes, the driving ceases prior to the inductor current reaching zero; and
    recirculate the inductor current through the inductor until a next charging event,
    wherein driving the inductor current through the first portion of the array of laser diodes further comprises driving the inductor current through a row of the array of laser diodes, and
    wherein all of the laser diodes included in the row of the array of laser diodes are coupled in parallel with each other,
    wherein anodes of all of the laser diodes included in the row of the array of laser diodes are directly coupled to each other, and
    wherein cathodes of all of the laser diodes included in the row of the array of laser diodes are directly coupled to a ground.

11. The diode driver of claim 10, wherein recirculating the inductor current through the inductor further comprises:
    closing a low-side switch coupled between a first lead of the inductor and the ground;
    closing a shorting switch coupled between a second lead of the inductor and the ground; and
    opening a high-side switch coupled between a power supply and the first lead.

12. The diode driver of claim 10 the operations further comprising:
    charging the inductor to increase the inductor current, the charging ceases when the inductor current reaches the predetermined threshold, wherein the controller resets the predetermined threshold for each charging of the inductor;

driving the inductor current through a second portion of the array of laser diodes, the second portion distinct from the first portion of the array of laser diodes, and the driving ceases prior to the inductor current reaching zero; and recirculating the inductor current through the inductor.

13. The diode driver of claim 12, wherein driving the inductor current through the second portion of the array of laser diodes further comprises driving the inductor current through a second row of the array of laser diodes.

14. The diode driver of claim 10, wherein charging the inductor further comprises:

closing a first electrically controlled switch disposed between a power supply and a first lead of the inductor; and closing a second electrically controlled switch coupled between a second lead of the inductor and the ground.

15. The diode driver of claim 10 wherein the controller which sets the predetermined threshold is a controller which is associated with a lidar sensor.

16. A lidar system comprising a controller configured to:

charge an inductor to increase an inductor current of the inductor, the charging ceases when the inductor current reaches a predetermined threshold, wherein the predetermined threshold is set by the controller;

drive the inductor current through a first portion of an array of laser diodes, the driving ceases prior to the inductor current reaching zero; and recirculate the inductor current through the inductor until a next charging event, wherein driving the inductor current through the first portion of the array of laser diodes further comprises driving the inductor current through a row of the array of laser diodes, and wherein all of the laser diodes included in the row of the array of laser diodes are coupled in parallel with each other, wherein anodes of all of the laser diodes included in the row of the array of laser diodes are directly coupled to each other, and wherein cathodes of all of the laser diodes included in the row of the array of laser diodes are directly coupled to a ground.

17. The lidar system of claim 16 wherein recirculating the inductor current through the inductor further comprises:

closing a low-side switch coupled between a first lead of the inductor and the ground;

closing a shorting switch coupled between a second lead of the inductor and the ground; and opening a high-side switch coupled between a power supply and the first lead.

18. The lidar system of claim 16 wherein the controller is further configured to:

charging the inductor to increase the inductor current, the charging ceases when the inductor current reaches the predetermined threshold, wherein the controller resets the predetermined threshold for each charging of the inductor;

driving the inductor current through a second portion of the array of laser diodes, the second portion distinct from the first portion of the array of laser diodes, and the driving ceases prior to the inductor current reaching zero; and recirculating the inductor current through the inductor.

19. The lidar system of claim 16, wherein driving the inductor current further comprises coupling a first lead of the inductor to the first portion of the array of laser diodes.

20. The lidar system of claim 19, wherein driving the inductor current further comprises de-coupling a second lead of the inductor from a power supply.

\* \* \* \* \*